United States Patent
Xie

(10) Patent No.: US 9,760,027 B2
(45) Date of Patent: Sep. 12, 2017

(54) SCANNER ROUTING METHOD FOR PARTICLE REMOVAL

(71) Applicant: United Microelectronics Corp., Hsinchu (TW)

(72) Inventor: Yong-Gang Xie, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 320 days.

(21) Appl. No.: 14/056,320

(22) Filed: Oct. 17, 2013

(65) Prior Publication Data
US 2015/0109590 A1    Apr. 23, 2015

(51) Int. Cl.
  *G03B 27/52* (2006.01)
  *G03B 27/32* (2006.01)
  *G03F 7/20* (2006.01)

(52) U.S. Cl.
  CPC ...... *G03F 7/70925* (2013.01); *G03F 7/70341* (2013.01)

(58) Field of Classification Search
  CPC ............... G03F 7/2041; G03F 7/70925; G03F 7/70908; G03F 7/70916; G03F 7/70341
  USPC ............ 355/30, 52, 53, 55, 67–75, 77; 250/492.1, 492.2, 492.22, 493.1, 548; 430/5, 8, 22, 30, 311, 312, 321
  See application file for complete search history.

(56) References Cited

U.S. PATENT DOCUMENTS

| | | | |
|---|---|---|---|
| 5,793,471 A | 8/1998 | Kanda et al. | |
| 6,028,659 A * | 2/2000 | Kaneko | G03F 7/70358 355/53 |
| 6,118,515 A * | 9/2000 | Wakamoto | G03F 7/70358 355/53 |
| 6,266,144 B1 * | 7/2001 | Li | G03F 7/70425 356/23 |
| 6,342,942 B1 * | 1/2002 | Uzawa | G03F 7/70358 355/53 |
| 6,576,919 B1 * | 6/2003 | Yoshida | G03F 7/70358 250/234 |
| 6,844,917 B2 | 1/2005 | Yoshida | |
| 2006/0082747 A1 * | 4/2006 | Fukuhara | G03B 27/42 355/53 |
| 2007/0177125 A1 * | 8/2007 | Shibazaki | G03F 7/70341 355/72 |
| 2007/0229789 A1 * | 10/2007 | Kawamura | G03F 7/70341 355/53 |
| 2007/0285639 A1 * | 12/2007 | Liang | G03B 27/42 355/53 |
| 2008/0068570 A1 * | 3/2008 | Streefkerk | G03F 7/70425 355/53 |
| 2008/0131817 A1 * | 6/2008 | Yoon | G03F 7/70916 430/319 |
| 2008/0212043 A1 * | 9/2008 | Nagasaka | G03F 7/70916 355/30 |

(Continued)

*Primary Examiner* — Christina Riddle
(74) *Attorney, Agent, or Firm* — J.C. Patents

(57) ABSTRACT

A scanner routing method for particle removal is disclosed. A dummy wafer coated with a viscosity builder is provided. The dummy wafer is moved, shot by shot, with an immersion scanner. The moving includes moving edge shots in a direction from the outside of the dummy wafer toward the inside of the same. The scanner routing method of the invention is beneficial to remove unnecessary particles or chemicals in the immersion liquid and therefore improve the performance of the product wafer which is subsequently run after the dummy wafer.

3 Claims, 6 Drawing Sheets

(56) References Cited

U.S. PATENT DOCUMENTS

| | | | |
|---|---|---|---|
| 2008/0212053 A1* | 9/2008 | Ottens | B82Y 10/00 355/53 |
| 2009/0027635 A1* | 1/2009 | De Jong | G03F 7/70925 355/30 |
| 2009/0061331 A1* | 3/2009 | Nakano | G03F 7/70341 430/30 |
| 2010/0103392 A1* | 4/2010 | Matsui | G03B 27/52 355/30 |
| 2010/0283979 A1* | 11/2010 | Nakano | G03F 7/70341 355/30 |

* cited by examiner

SCANNER ROUTING METHOD FOR PARTICLE REMOVAL

BACKGROUND OF THE INVENTION

Field of Invention

The present invention relates to an integrated circuit (IC) fabrication, and particularly to a scanner routing method for particle removal.

Description of Related Art

Lithography is one of the most important techniques utilized in semiconductor manufacture. Among various lithography techniques, the immersion lithography technique has been well developed to cope with the miniaturization of IC devices accompanying with the increase in degree of IC integration. An immersion lithography process is conducted in a liquid-phase environment, and has a higher resolution because the refractive index of a liquid is closer to that of the photoresist material as compared with air. Therefore, the dimensions of IC devices can be reduced with the immersion lithography technique.

However, since the photoresist layer directly contacts with the immersion liquid during the exposure step of an immersion lithography process, the immersion liquid is easily contaminated by the chemicals out-diffusing from the photoresist layer. Such contaminated immersion liquid may also diffuse into the photoresist layer and alter the properties of the latter. Therefore, the critical dimension and the uniformity of the photoresist patterns are adversely affected. Accordingly, high attention is drawn to how to remove unnecessary particles or chemicals in the immersion liquid.

SUMMARY OF THE INVENTION

The present invention provides a scanner routing method for particle removal, in which unnecessary particles or chemicals in the immersion liquid can be effectively removed during the idle period of the immersion scanner.

The present invention provides a scanner routing method for particle removal. A dummy wafer coated with a viscosity builder is provided. The dummy wafer is moved, shot by shot, with an immersion scanner. The said moving includes moving edge shots in a direction from the outside of the dummy wafer toward the inside of the same.

According to an embodiment of the present invention, the dummy wafer is a bare wafer without patterns.

According to an embodiment of the present invention, the bare wafer includes silicon.

According to an embodiment of the present invention, the viscosity builder includes hexamethyldisilazane (HMDS).

According to an embodiment of the present invention, the scanner routing method is performed only during an idle period of the immersion scanner.

According to an embodiment of the present invention, a photomask is not used during the moving.

According to an embodiment of the present invention, an exposure light is not used during the moving.

According to an embodiment of the present invention, the moving is executed by a wafer chuck moving element.

According to an embodiment of the present invention, the moving further includes moving, shot by shot, the edge shots in another direction from the inside of the dummy wafer toward the outside of the same.

According to an embodiment of the present invention, the moving includes moving, shot by shot, the full dummy wafer in a first routing sequence; and moving, shot by shot, the full dummy wafer in a second routing sequence with a direction reverse to a direction of the first routing sequence.

According to an embodiment of the present invention, the moving includes moving, shot by shot, the full dummy wafer in a first routing sequence; and moving, shot by shot, the edge shots of the dummy wafer in a second routing sequence different from the first routing sequence.

According to an embodiment of the present invention, the moving includes moving, shot by shot, the full dummy wafer in a first routing sequence; and moving, shot by shot, a portion of the edge shots of the dummy wafer in a second routing sequence different from the first routing sequence.

According to an embodiment of the present invention, the moving further includes moving, shot by shot, another portion of the edge shots of the dummy wafer in a third routing sequence different from the first and second routing sequences.

According to an embodiment of the present invention, the edge shots are shots around a notch of the dummy wafer.

According to an embodiment of the present invention, the scanner routing method is for removing particles in an immersion liquid.

According to an embodiment of the present invention, a product wafer is transferred to the immersion scanner after the particles are removed.

In view of the above, in the present invention, a dummy wafer having a sticky surface is provided and edge shots thereof are removed in a specific direction (i.e. the direction from the outside toward the inside of the wafer) with an immersion scanner, so that more particles in the immersion liquid are stuck on the dummy wafer. The scanner routing method of the invention is beneficial to remove unnecessary particles or chemicals in the immersion liquid and therefore improve the performance of the product wafer which is subsequently run after the dummy wafer.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
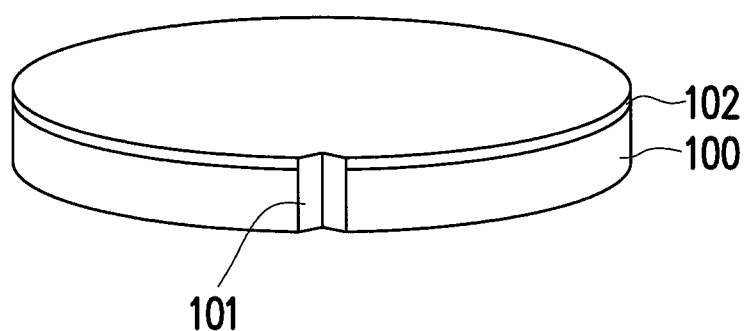
FIG. 1A to FIG. 1C show a scanner routing method for particle removal according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The present invention provides a scanner routing method for particle removal. It has been found by the inventors surprisingly under study that, more particles are observed in the wafer edge when edge shots are moved in a direction from the outside toward the inside of the wafer, while less particles are observed in the wafer edge when edge shots are moved in a direction from the inside toward the outside of the wafer. Accordingly, such concept is applied by the inventors to develop several scanner routing methods for removing unnecessary particles in the immersion liquid. The particles may be photoresist residues or particles from a bubble extraction system (BES) ring, a bevel, a mirror block etc.

First Embodiment

Figure 1B:
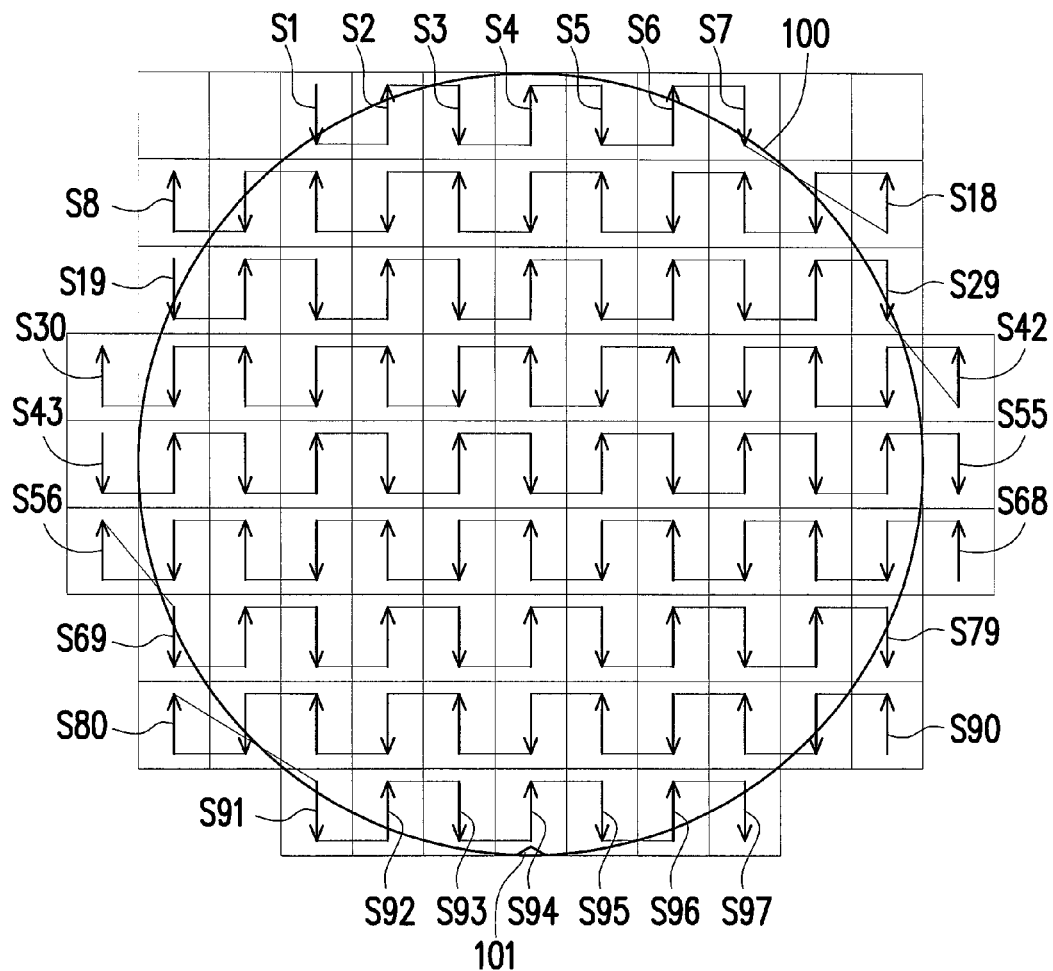
Figure 1C:
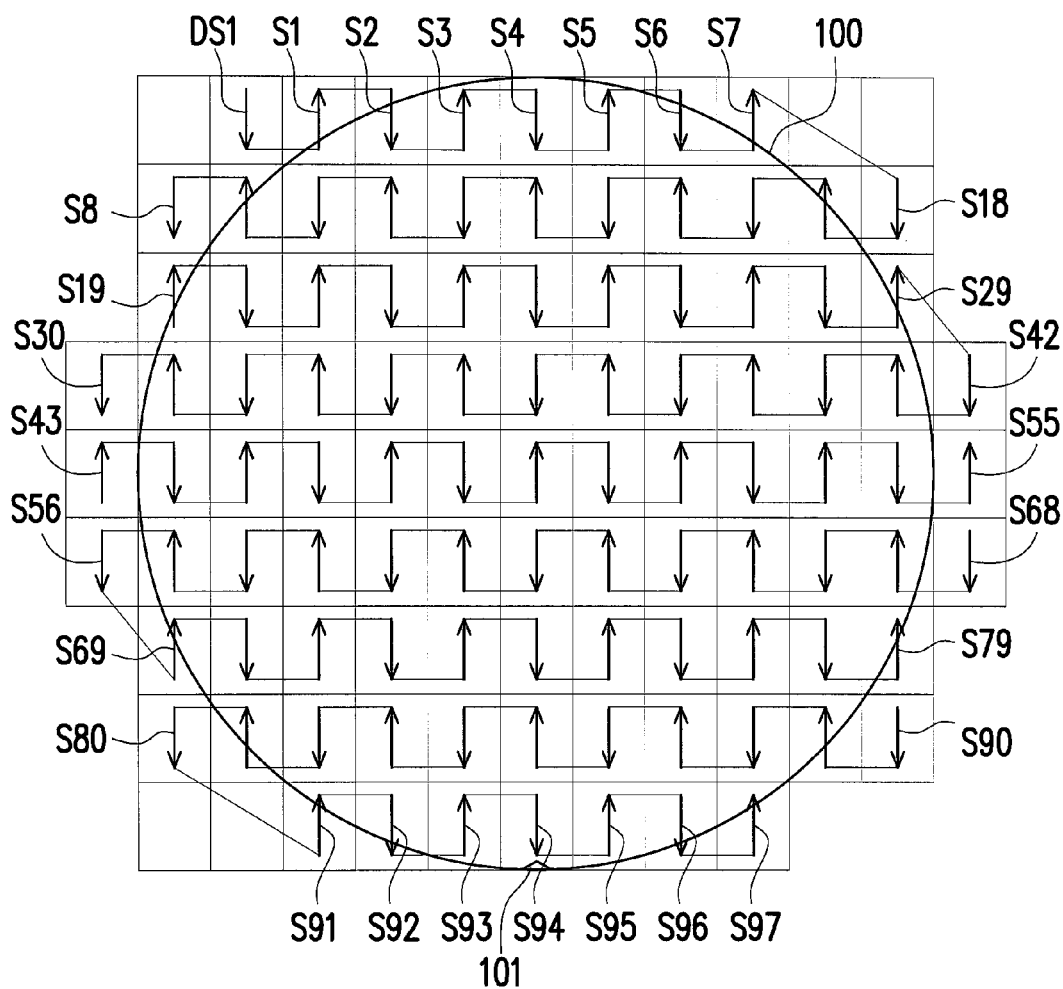

FIG. 1A to FIG. 1C show a scanner routing method for particle removal according to a first embodiment of the present invention.

Referring to FIG. 1A, in a cross-sectional view, a dummy wafer 100 coated with a viscosity builder 102 is provided. The dummy wafer 100 is a bare wafer without patterns. Besides, the dummy wafer 100 has a notch 101 to convey wafer orientation. The bare wafer includes a semiconductor material, such as silicon. The viscosity builder 102 includes hexamethyldisilazane (HMDS).

In a lithography process, before a photoresist layer is coated on the wafer, HMDS is sprayed on the wafer to enhance the adhesion between the photoresist layer and the wafer. However, in the present invention, the viscosity builder 102 such as HMDS is provided on the dummy wafer 100 for sticking particles and taking particles away from the immersion liquid, rather than increasing the adhesion between the photoresist layer and the dummy wafer 100. Therefore, in the invention, a photoresist layer is not coated on the dummy wafer 100.

Referring to FIG. 1B, in a plan view, the full dummy wafer 100 is moved, shot by shot, in a first routing sequence. The dummy wafer 100 is moved by a wafer chuck moving element (such as a motor) of an immersion scanner. In an embodiment, a first predetermined program is input, by using a computer, to the immersion scanner to initiate the first routing sequence. The first predetermined program divides the wafer 100 into a plurality of shots (e.g. 97 shots), and removes the wafer 100, shot by shot, along the arrow direction. In this embodiment, each of the 97 shots S1-S97 covers at least a portion of the wafer area. It is appreciated by people having ordinary skill in the art that, the number of shots is not limited by the present invention and can be adjusted upon the process requirements.

The $N^{th}$ shot and the $(N+1)^{th}$ shot are moved in opposite directions in the first routing sequence, and N is a positive integer. Specifically, the odd shots S1, S3, . . . , S97 are moved in a first direction, and the even shots S2, S4, . . . , S96 are moved in a second direction opposite to the first direction. For example, in a figure plane, the first direction can be an up-to-down direction while the second direction can be a down-to-up direction; alternatively, in an X-Y plane, the first direction can be a "−Y" direction while the second direction can be a "+Y" direction.

In view of an in-and-out relationship, in the first routing sequence of the first embodiment, the odd edge shots S91, S93, S95 and S97 are moved in a direction from the inside of the dummy wafer 100 toward the outside of the same, while the even edge shots S92, S94 and S96 are moved in a direction from the outside of the dummy wafer 100 toward the inside of the same.

Referring to FIG. 1C, in a plan view, the full dummy wafer 100 is moved, shot by shot, in a second routing sequence with a direction reverse to a direction of the first routing sequence. In an embodiment, a second predetermined program is input, by using a computer, to the immersion scanner to initiate the second routing sequence. The second predetermined program divides the wafer 100 into a plurality of shots (e.g. 98 shots), and removes the wafer 100, shot by shot, along the arrow direction. In this embodiment, 98 shots include a dummy shot DS1 outside of the wafer area and 97 shots S1-S97 each covering at least a portion of the wafer area.

In this embodiment, the shot number set by the second predetermined program is different from that set by the first predetermined program, but the present invention is not limited thereto. In another embodiment, the shot number set by the second predetermined program can be the same as that set by the first predetermined program.

The $N^{th}$ shot and the $(N+1)^{th}$ shot are moved in opposite directions in the second routing sequence, and N is a positive integer. Specifically, the odd shots S1, S3, . . . , S97 are moved in a third direction, and the dummy shot DS1 and the even shots S2, S4, . . . , S96 are moved in a fourth direction opposite to the third direction. For example, in a figure plane, the third direction can be a down-to-up direction while the fourth direction can be an up-to-down direction; alternatively, in an X-Y plane, the third direction can be a "+Y" direction while the fourth direction can be a "−Y" direction.

In view of an in-and-out relationship, in the second routing sequence of the first embodiment, the odd edge shots S91, S93, S95 and S97 are moved in a direction from the outside of the dummy wafer 100 toward the inside of the same, while the even edge shots S92, S94 and S96 are moved in a direction from the inside of the dummy wafer 100 toward the outside of the same.

Besides, since the moving is not for exposing the wafer but for removing particles from the immersion liquid, a photomask and an exposure light are not used during the moving in the first and second routing sequences.

After the first and second routing sequences of the first embodiment, each of the edge shots S91 to S97 is moved not only in a direction from the outside toward the inside of the dummy wafer 100, but also in another direction from the inside toward the outside of the dummy wafer 100.

As stated above, it has been found by the inventors that, the moving direction from the outside toward the inside of the wafer helps to adhere more particles to the viscosity builder 102 and therefore decrease particles in the immersion liquid. Herein, each of the edge shots S91 to S97 is moved in a direction from the outside toward the inside of the wafer. 100, so that particles in the immersion liquid can be effectively decreased. Specifically, the shots S92, S94 and S96 are moved in such direction in the first routing sequence (as shown in FIG. 1B) and the shots S91, S93, S95 and S97 are moved in such direction in the second routing sequence (as shown in FIG. 1C).

Although each of the edge shots S91 to S97 is also moved in a direction from the inside toward the outside of the wafer 100, this moving does not bring any particle back to the immersion liquid because of the sticky surface of the wafer 100. Specifically, due to the sticky surface provided by the viscosity builder 102 on the wafer 100, particles would remain on the wafer 100 once they are stuck on the viscosity builder 102.

That is, on one hand, the moving in a direction from the outside toward the inside of the wafer removes more particles from the immersion liquid based on the concept of the invention. On the other hand, the moving in a direction from the inside toward the outside of the wafer doest not bring the particles back to the immersion liquid.

In the said embodiment in which the edge shots are shots (e.g. shots S91 to S97) around the notch 101 of the dummy wafer 100 is provided for illustration purposes, and is not construed as limiting the present invention.

Besides, the scanner routing method of the invention is performed only during the idle period of the immersion scanner, such as routine maintenance, machine down or machine idle, so that the throughput of the immersion scanner is not affected.

Second Embodiment

Figure 2:
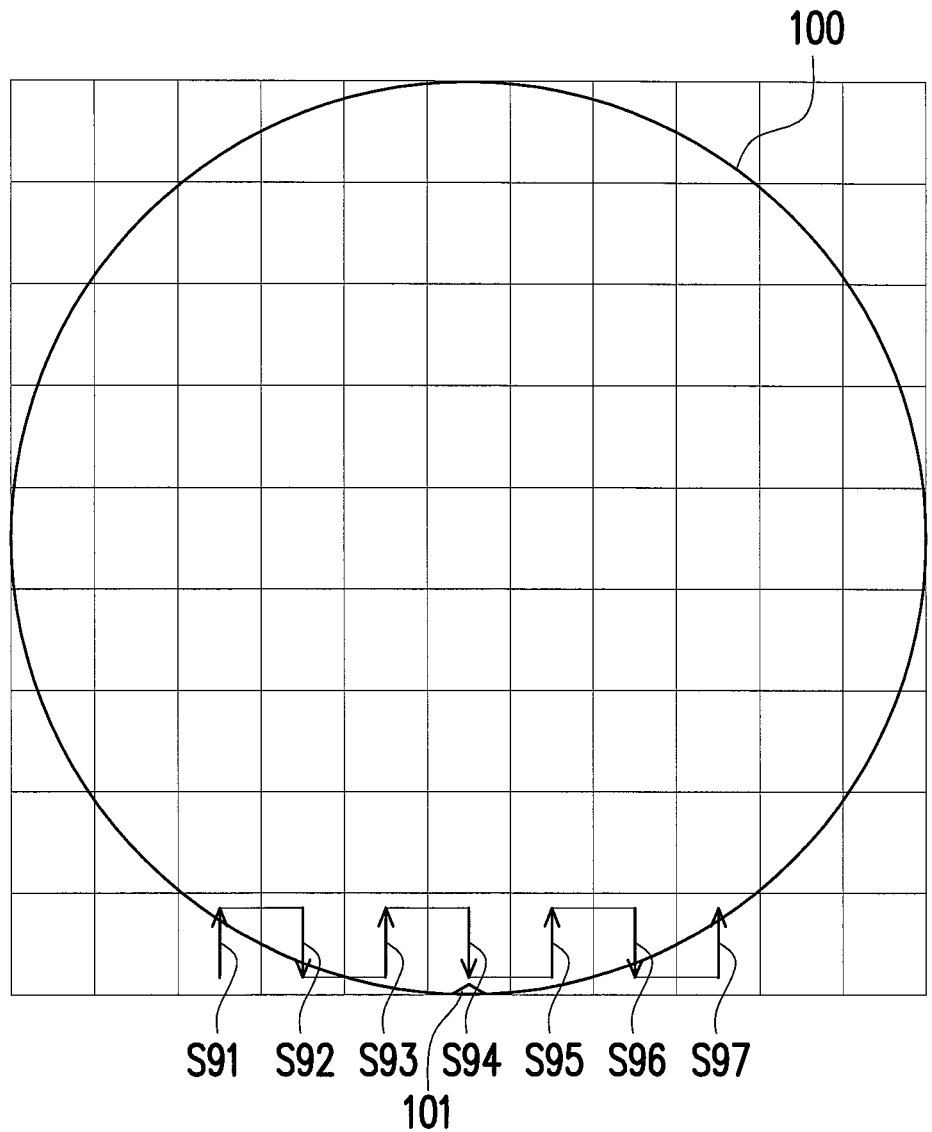
FIG. 2 is a plan view showing a scanner routing method for particle removal according to a second embodiment of the present invention.

FIG. 2 is a plan view showing a scanner routing method for particle removal according to a second embodiment of the present invention.

The scanner routing method of second embodiment is similar to that of the first embodiment, and the difference lies in that the second routing sequence of the second embodiment is not for the full wafer but for the edge shots only. In other words, in the second embodiment, only the edge shots S91-S97 around the notch 101 are subjected to the second routing sequence. The difference between them is described below and the similarities are not iterated herein.

First, referring to the steps in FIG. 1A and FIG. 1B, a dummy wafer 100 coated with a viscosity builder 102 is provided, and the full dummy wafer 100 is moved, shot by shot, in a first routing sequence. With reference to FIG. 1B, in the first routing sequence of the second embodiment, the odd edge shots S91, S93, S95 and S97 are moved in a direction from the inside toward the outside of the dummy wafer 100, while the even edge shots S92, S94 and S96 are moved in a direction from the outside toward the inside of the dummy wafer 100.

Referring to FIG. 2, the edge shots S91-S97 of the dummy wafer 100 are moved, shot by shot, in a second routing sequence different from the first routing sequence. Specifically, the odd edge shots S91, S93, S95 and S97 are moved in a direction from the outside toward the inside of the dummy wafer 100, while the even edge shots S92, S94 and S96 are moved in a direction from the inside toward the outside of the dummy wafer 100.

After the first and second routing sequences of the second embodiment, each of the edge shots S91 to S97 is moved not only in a direction from the outside toward the inside of the dummy wafer 100, but also in another direction from the inside toward the outside of the dummy wafer 100.

Herein, each of the edge shots S91 to S97 is moved in a direction from the outside toward the inside of the wafer 100, so that particles in the immersion liquid can be effectively decreased. Specifically, the shots S92, S94 and S96 are moved in such direction in the first routing sequence (as shown in FIG. 1B) and the shots S91, S93, S95 and S97 are moved in such direction in the second routing sequence (as shown in FIG. 2).

Third Embodiment

Figure 3:
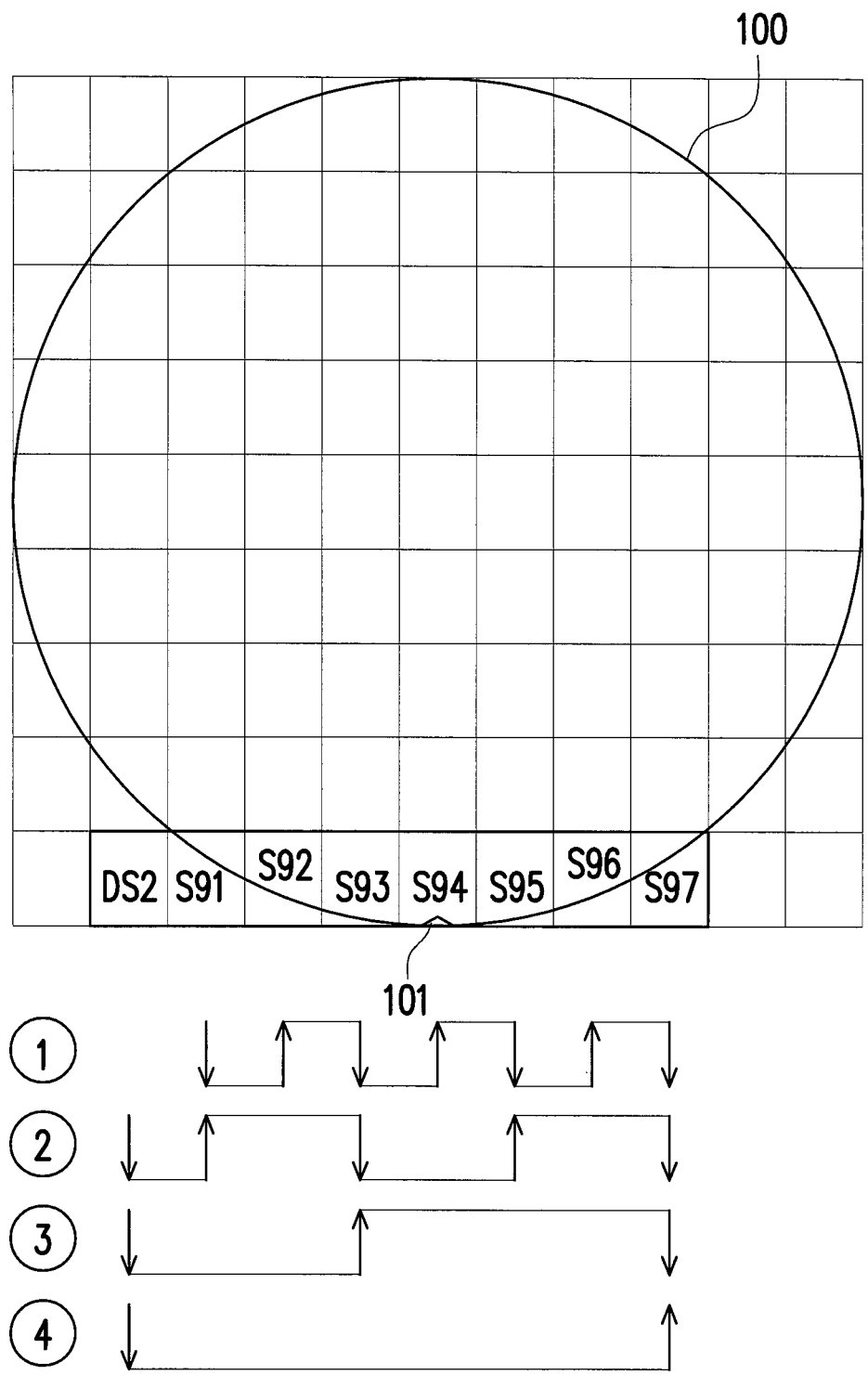
FIG. 3 is a plan view showing a scanner routing method for particle removal according to a third embodiment of the present invention.

FIG. 3 is a plan view showing a scanner routing method for particle removal according to a third embodiment of the present invention.

The scanner routing method of third embodiment is similar to that of the second embodiment, and the difference lies in that the defect worse area (such as the notch area) is subjected to more local routing sequences in the third embodiment. The difference between them is described below and the similarities are not iterated herein.

First, referring to the steps in FIG. 1A and FIG. 1B, a dummy wafer 100 coated with a viscosity builder 102 is provided, and the full dummy wafer 100 is moved, shot by shot, in a first routing sequence. With reference to FIG. 1B, in the first routing sequence of the third embodiment, the odd edge shots S91, S93, S95 and S97 are moved in a direction from the inside toward the outside of the dummy wafer 100, while the even edge shots S92, S94 and S96 are moved in a direction from the outside toward the inside of the dummy wafer 100, as shown in a sub-step ① in FIG. 3.

Referring to FIG. 3, a portion of the edge shots of the dummy wafer 100 are moved, shot by shot, in a second routing sequence different from the first routing sequence. In the third embodiment, the edge shots DS2, S91, S93, S95 and S97 are moved, shot by shot, in the second routing sequence, wherein the dummy shot DS2 is outside of the wafer area. Specifically, the shots DS2, S93 and S97 are moved in a direction from the inside toward the outside of the dummy wafer 100, while the S91 and S95 are moved in a direction from the outside toward the inside of the dummy wafer 100, as shown in a sub-step ② in FIG. 3.

Continue referring to FIG. 3, another portion of the edge shots of the dummy wafer 100 are moved, shot by shot, in a third routing sequence different from the first and second routing sequences. In the third embodiment, the edge shots DS2, S93 and S97 are moved, shot by shot, in the third routing sequence. Specifically, the shots DS2 and S97 are moved in a direction from the inside toward the outside of the dummy wafer 100, while the S93 is moved in a direction from the outside toward the inside of the dummy wafer 100, as shown in a sub-step ③ in FIG. 3.

Continue referring to FIG. 3, still another portion of the edge shots of the dummy wafer 100 are moved, shot by shot, in a fourth routing sequence different from the first, second and third routing sequences. In the third embodiment, the edge shots DS2 and S97 are moved, shot by shot, in the fourth routing sequence. Specifically, the shot DS2 is moved in a direction from the inside toward the outside of the dummy wafer 100, while the S97 is moved in a direction from the outside toward the inside of the dummy wafer 100, as shown in a sub-step ④ in FIG. 3.

Herein, each of the edge shots S91 to S97 is moved in a direction from the outside toward the inside of the wafer 100, so that particles in the immersion liquid can be effectively decreased. Specifically, the shots S92, S94 and S96 are moved in such direction in the first routing sequence (as shown in FIG. 1B and the sub-step ① in FIG. 3); the shots S91 and S95 are moved in such direction in the second routing sequence (as shown in the sub-step ② in FIG. 3); the shot S93 is moved in such direction in the third routing sequence (as shown in the sub-step ③ in FIG. 3); and the shot S97 is moved in such direction in the fourth routing sequence (as shown in the sub-step ④ in FIG. 3).

It is noted that the three sub-steps ② to ④ in FIG. 3 are provided to replace the single step in FIG. 2 for removing particles around the notch area, but the present invention is not limited thereto. It is appreciated by people having ordinary skill in the art that the number of the local routing sequences around the notch area can be adjusted upon the process requirements. Besides, the three sub-steps ② to ④ in FIG. 3 and the step in FIG. 2 can be combined to provide a better particle removing efficiency around the notch area.

Fourth Embodiment

Figure 4:
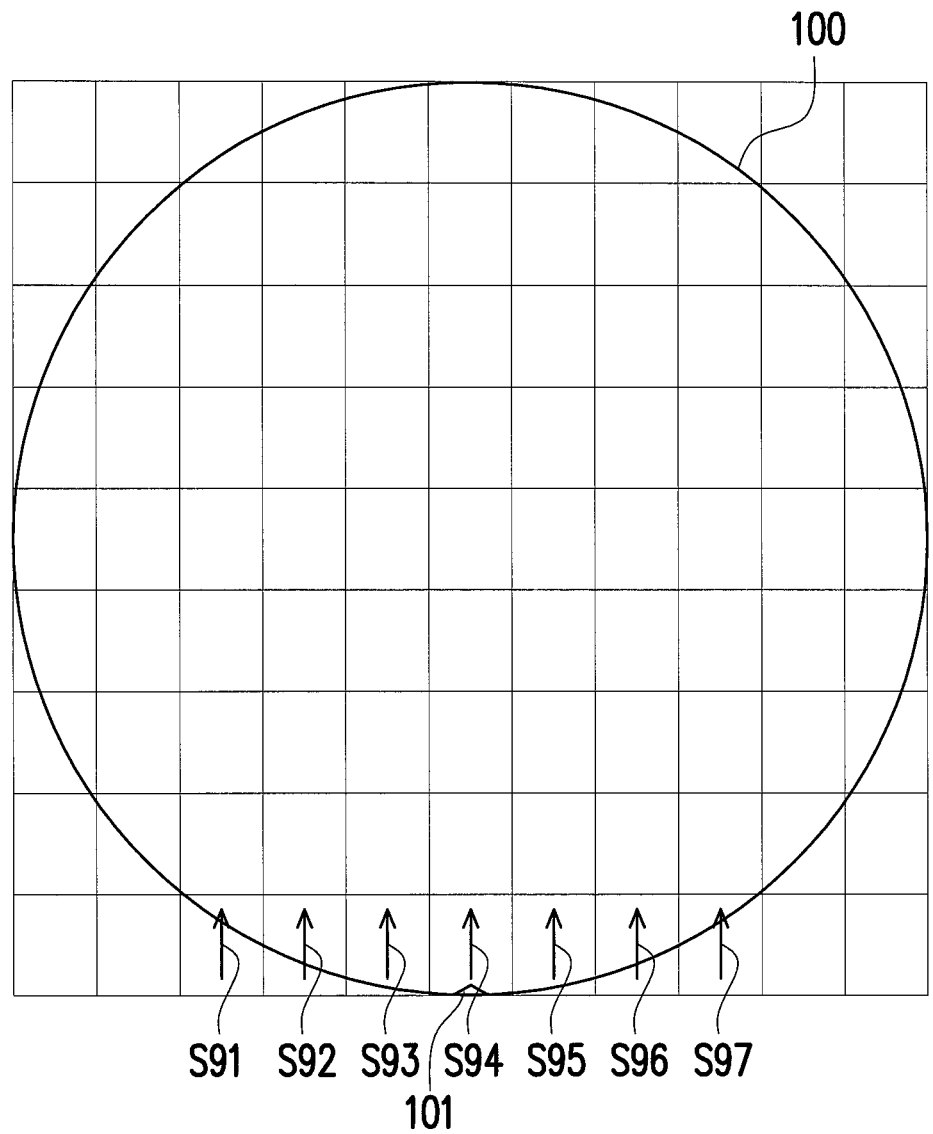
FIG. 4 is a plan view showing a scanner routing method for particle removal according to a fourth embodiment of the present invention.

FIG. 4 is a plan view showing a scanner routing method for particle removal according to a fourth embodiment of the present invention.

First, referring to the steps in FIG. 1A, a dummy wafer 100 coated with a viscosity builder 102 is provided. Thereafter, referring to FIG. 4, the dummy wafer 100 is moved, shot by shot, in a direction from the outside toward the inside of the dummy wafer 100. In an embodiment, a predetermined program is input, by using a computer, to the immersion scanner to initiate a routing sequence, and removes the wafer 100, shot by shot, along the arrow direction. The routing sequence of the fourth embodiment is only for edge shots S91-S97 around the notch 101 of the dummy wafer 100. Herein, the $N^{th}$ shot and the $(N+1)^{th}$ shot are moved in the same direction from the outside to the inside of the dummy wafer 100, and N is a positive integer. Specifically, each of the edge shots S91 to S97 is moved in a direction from the outside toward the inside of the wafer 100, so that particles in the immersion liquid can be effectively decreased.

After the particles are removed with the method of one of the said embodiments, a product wafer is transferred to the immersion scanner for production. The product wafer has HMDS and a photoresist layer coated thereon, and a photomask and an exposure light are required during the patterning step.

In summary, in the present invention, a dummy wafer having a sticky surface is provided and edge shots thereof are removed in a specific direction (i.e. the direction from the outside toward the inside of the wafer) with an immersion scanner, so that more particles in the immersion liquid are stuck on the dummy wafer. The scanner routing method of the invention is beneficial to remove unnecessary particles or chemicals in the immersion liquid and therefore improve the performance of the product wafer which is subsequently run after the dummy wafer.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A scanner routing method for particle removal, comprising:

providing a dummy wafer only coated with a viscosity builder; and moving, shot by shot, the dummy wafer with an immersion scanner, comprising moving each of edge shots around a notch of the dummy wafer in a direction from an outside of the dummy wafer toward an inside of the same, wherein the moving comprises:

moving, shot by shot, the full dummy wafer in a first routing sequence, wherein the $N^{th}$ shot and the $(N+1)^{th}$ shot are moved in opposite directions in the first routing sequence, and N is a positive integer; and moving, shot by shot, the edge shots of the dummy wafer in a second routing sequence different from the first routing sequence, wherein the second routing sequence directly follows the first routing sequence, such that the edge shots are moved twice.

2. A scanner routing method for particle removal, comprising:

providing a dummy wafer only coated with a viscosity builder; and moving, shot by shot, the dummy wafer with an immersion scanner, comprising moving each of edge shots around a notch of the dummy wafer in a direction from an outside of the dummy wafer toward an inside of the same, wherein the moving comprises:

moving, shot by shot, the full dummy wafer in a first routing sequence, wherein the $N^{th}$ shot and the $(N+1)^{th}$ shot are moved in opposite directions in the first routing sequence, and N is a positive integer; and moving, shot by shot, a portion of the edge shots of the dummy wafer in a second routing sequence different from the first routing sequence, wherein the second routing sequence directly follows the first routing sequence, such that the portion of the edge shots is moved twice.

3. The scanner routing method of claim 2, wherein the moving further comprises:

moving, shot by shot, another portion of the edge shots of the dummy wafer in a third routing sequence different from the first and second routing sequences.

* * * * *